United States Patent
Woolsey et al.

(10) Patent No.: US 7,298,132 B2
(45) Date of Patent: Nov. 20, 2007

(54) CURRENT SENSOR

(75) Inventors: Kevin Woolsey, Snohomish, WA (US); L. Mark Marion, Woodinville, WA (US); Steven Knudson, Seattle, WA (US)

(73) Assignee: Crane Co., Lynnwood, WA (US)

( * ) Notice: Subject to any disclaimer, the term of this patent is extended or adjusted under 35 U.S.C. 154(b) by 0 days.

(21) Appl. No.: 11/403,544

(22) Filed: Apr. 13, 2006

(65) Prior Publication Data

US 2006/0232902 A1    Oct. 19, 2006

Related U.S. Application Data

(60) Provisional application No. 60/671,237, filed on Apr. 13, 2005.

(51) Int. Cl.
*G01R 33/07* (2006.01)
(52) U.S. Cl. .................................................. 324/117 H
(58) Field of Classification Search .................... None
See application file for complete search history.

(56) References Cited

U.S. PATENT DOCUMENTS

| | | | |
|---|---|---|---|
| 4,002,967 A * | 1/1977 | Fennell | 324/260 |
| 5,416,407 A * | 5/1995 | Drafts | 324/117 H |
| 5,734,535 A * | 3/1998 | Nakata et al. | 324/262 |
| 5,874,848 A * | 2/1999 | Drafts et al. | 324/117 H |
| 5,923,162 A | 7/1999 | Drafts et al. | |
| 6,005,383 A | 12/1999 | Savary et al. | |
| 6,426,617 B1 | 7/2002 | Haensgen et al. | |
| 6,429,639 B1 | 8/2002 | Pelly | |
| 6,545,456 B1 | 4/2003 | Radosevich et al. | |
| 2004/0056647 A1 | 3/2004 | Stauth et al. | |
| 2006/0255793 A1* | 11/2006 | Montreuil | 324/117 R |

* cited by examiner

*Primary Examiner*—Jermele Hollington
(74) *Attorney, Agent, or Firm*—Christensen O'Connor Johnson Kindness PLLC

(57) ABSTRACT

A Hall effect generator chip is mounted between adjacent ends of an annular, horseshoe spacer of nonmagnetic material. The generator is sensitive to the flux density (B field) tangential to its top and bottom surfaces. The spacer and generator are sandwiched between ferromagnetic rings, each having a small air gap overlying/underlying the generator. A circuit including the generator supplies an output linearly proportional to the current of an adjacent conductor with reduced hysteresis and small variability over a temperature range.

11 Claims, 8 Drawing Sheets

CURRENT SENSOR

CROSS-REFERENCE TO RELATED APPLICATION

This application claims the benefit of application Ser. No. 60/671,237, filed Apr. 13, 2005.

BACKGROUND

Known current sensors have a magnetic circuit, typically a C-shaped core of magnetic material having adjacent ends separated by an air gap. The core is meant to concentrate the magnetic field emitted from a current-carrying conductor that may pass through the core one or more times, such as by being looped around a leg of the C. The core can be an open square, generally rectangular, or approximately circular, for example, and a Hall effect device is typically placed in the air gap between the opposing ends. The object is to detect the strength of the magnetic field in the air gap and supply a corresponding varying voltage signal. The following patents and patent publications show current sensors of the general type with which the present invention is concerned, such patents being expressly incorporated by reference herein:

| U.S. Pat./Publication No. | Issue Date | Inventor(s) |
| --- | --- | --- |
| 5,923,162 | Jul. 13, 1999 | Drafts et al. |
| 6,005,383 | Dec. 21, 1999 | Savary et al. |
| 6,426,617 B1 | Jul. 30, 2002 | Haensgen et al. |
| 6,429,639 B1 | Aug. 6, 2002 | Pelly |
| 6,545,456 B1 | Apr. 8, 2003 | Radosevich et al. |
| 2004/0056647 A1 | Mar. 25, 2004 | Stauth et al. |

Accuracy of the known devices may depend on the working environment, and the devices may be subject to magnetic hysteresis, both of which may affect reliability, particularly when sensing smaller currents.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The present invention provides a Hall effect current sensor with high sensitivity and linearity, and reduced hysteresis and temperature variation. In one aspect of the invention, a Hall effect generator chip is mounted between the ends of an annular, horseshoe or "C" spacer of nonmagnetic material. The spacer and generator are sandwiched between ferromagnetic rings. Each ring has a small air gap overlying or underlying the generator. The generator is sensitive to the flux density (B field) tangential to its flat top and bottom surfaces adjacent to the air gaps. The ferromagnetic rings act as the magnetic circuit, also known as the magnetic concentrator or core. The core-spacer-generator assembly can be compactly mounted on a circuit board with various leads (power, ground, output, test leads, etc.), and other circuits can be included to improve performance even further if desired.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
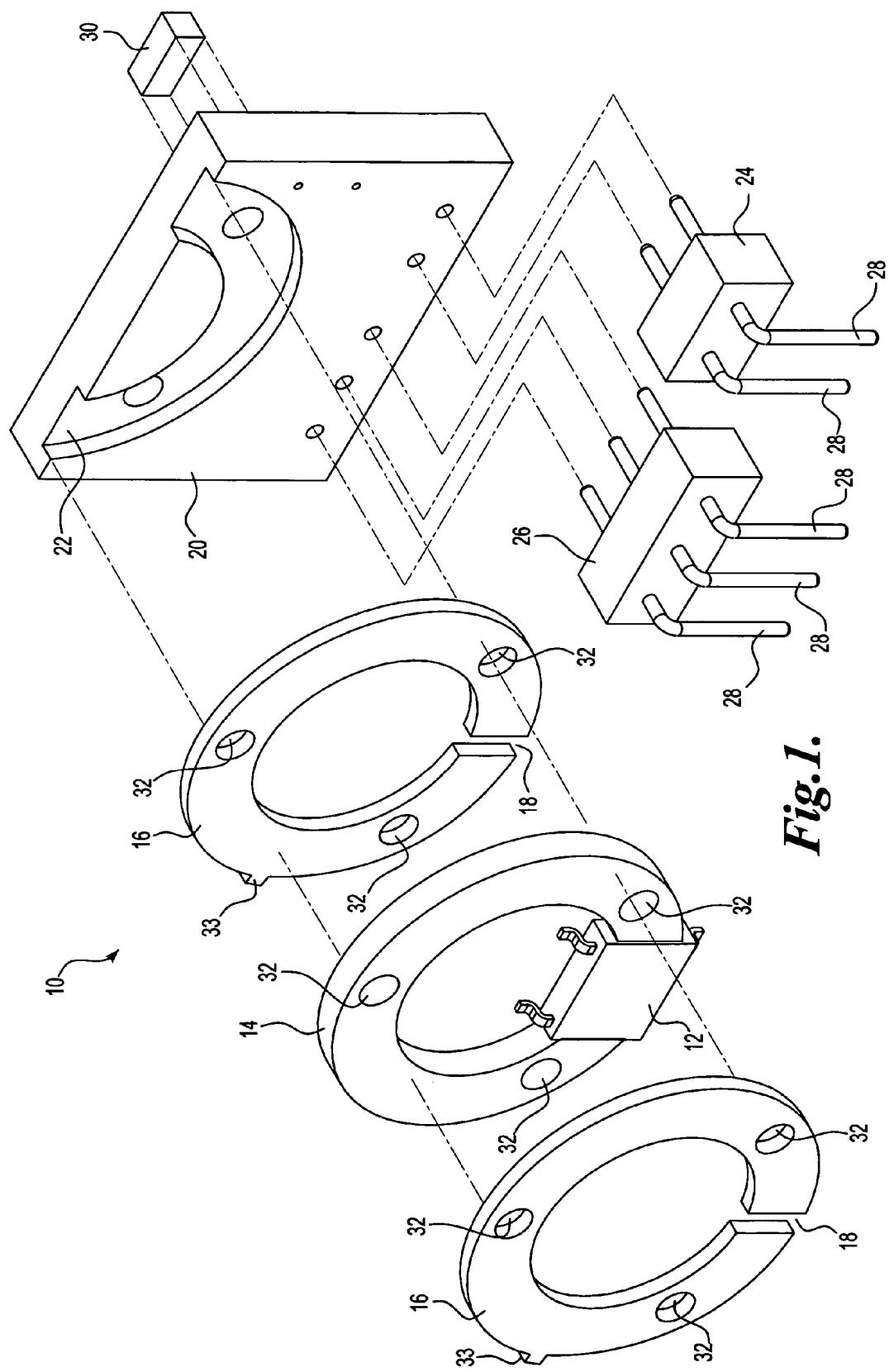
FIG. 1 is a top perspective of a current sensor in accordance with the present invention with parts shown in exploded relationship.
Figure 2:
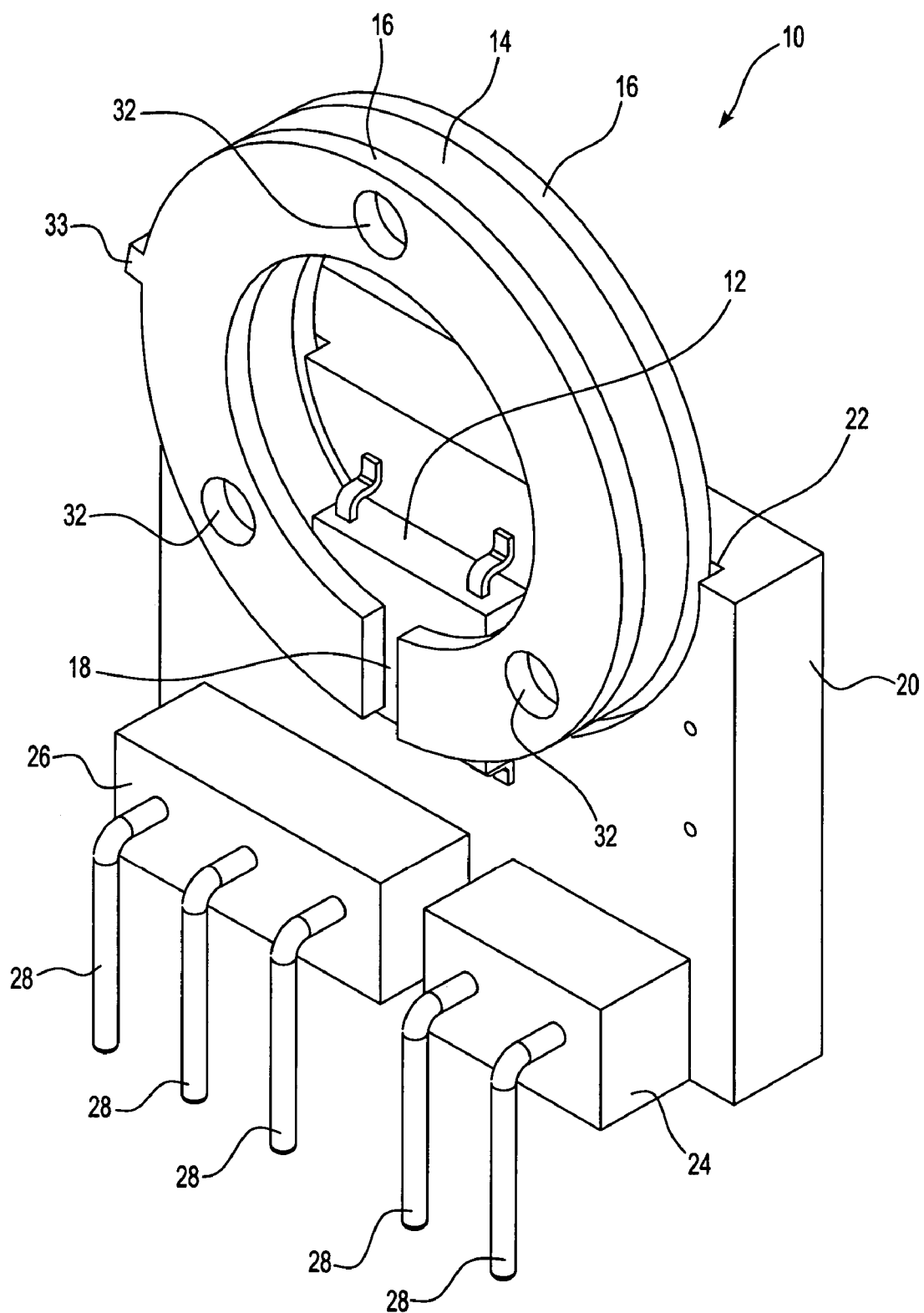
FIG. 2 is a corresponding top perspective with parts assembled.

The present invention includes a unique packaging of a Hall effect current sensor with increased sensitivity and linearity and reduced hysteresis and temperature variation. An embodiment of the current sensor system 10 is shown diagrammatically in FIGS. 1 and 2. A Hall effect generator chip 12 is mounted between adjacent ends of an annular, horseshoe mounting member or spacer 14 of nonmagnetic material, such as a suitable plastic. The generator is sensitive to the flux density (B field) tangential to its wide, flat top and bottom surfaces which can be coplanar with the flat surfaces of the spacer. The spacer and generator are sandwiched between ferromagnetic rings 16. Each ring has a large central opening and a small air gap 18 overlying/underlying the generator 12. A circuit board 20 has a semicircular mounting recess 22 that snugly receives approximately one-half of the circumference of the lower ferromagnetic ring 16. Input/output blocks 24, 26 with corresponding input and output leads 28 are mounted on the board, as is a separate capacitor 30.

Figure 3:
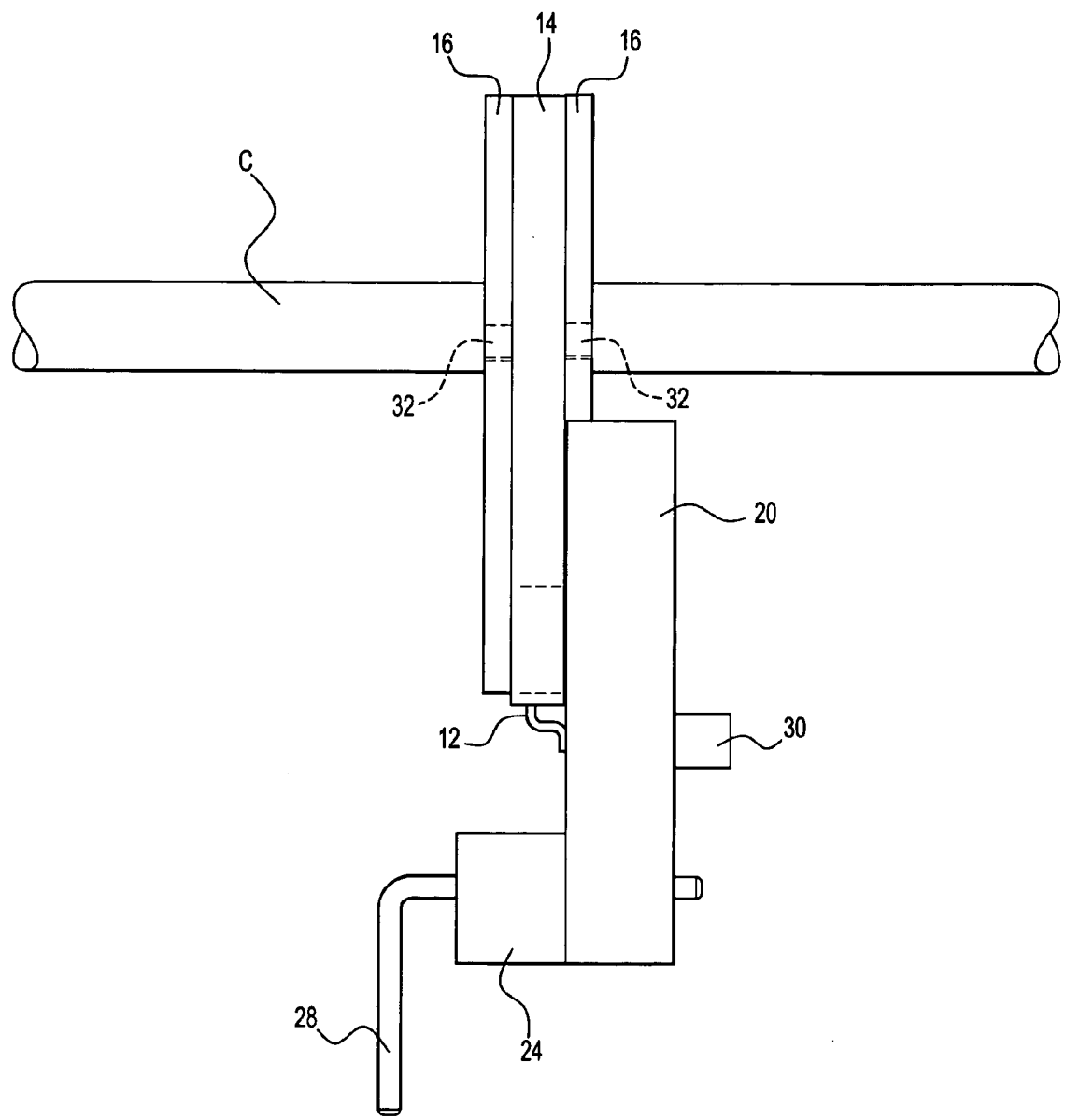
FIG. 3 is a somewhat diagrammatic side elevation of the current sensor of FIG. 1.
Figure 4:
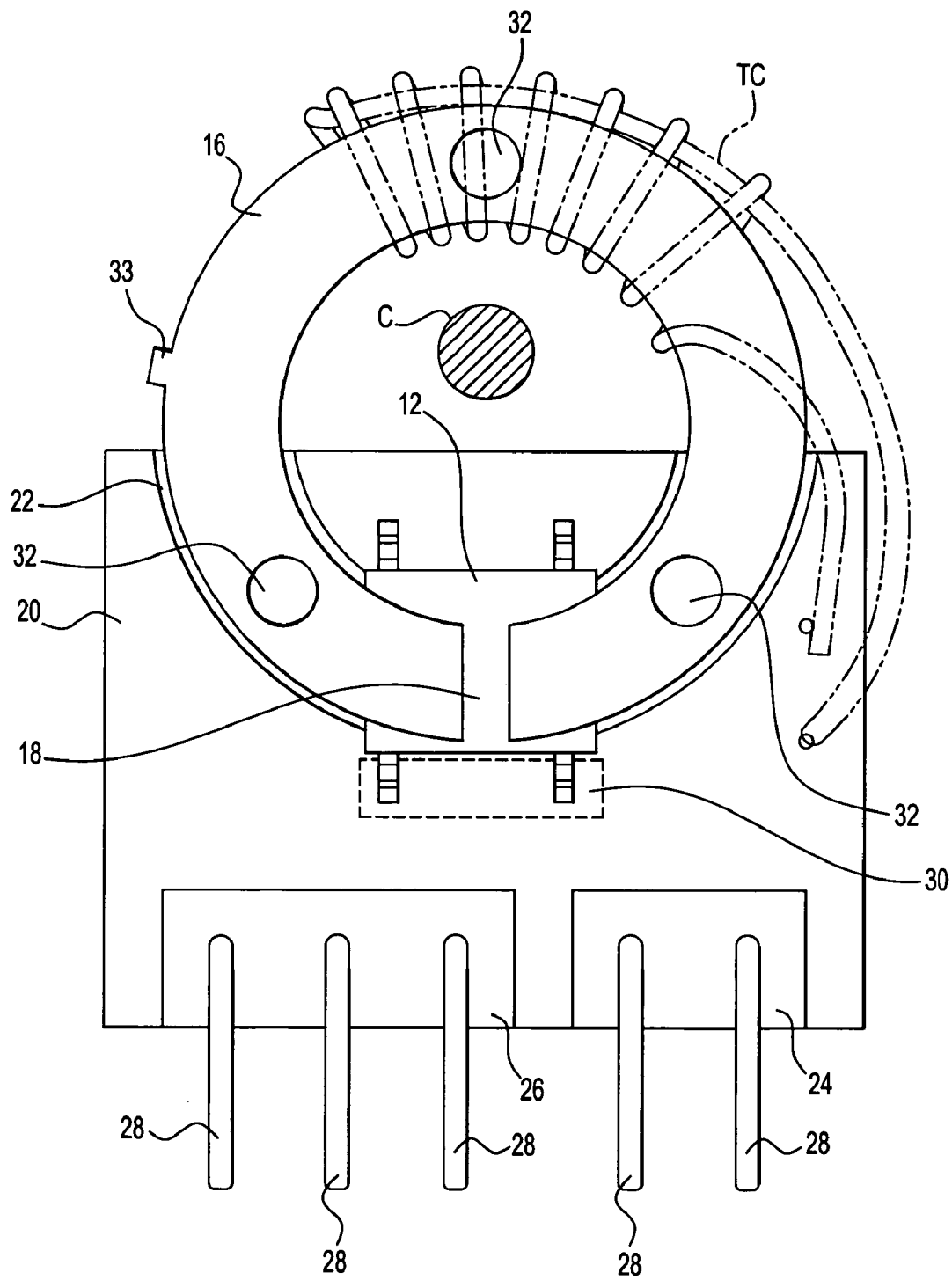
FIG. 4 is a somewhat diagrammatic front elevation of the current sensor of FIG. 1.

With reference to FIG. 3 and FIG. 4, the conductor C for which current information is desired passes through the aligned central openings of the ferromagnetic rings 16 and spacer 14. The current flowing in the conductor creates a B field that will be contained in and concentrated by the ferromagnetic rings 16. The ferromagnetic rings with the air gaps magnify the field observed by the chip 12, and at both sides of the chip. The double field magnification creates a greater sensitivity to the current in the conductor. The field that is tangential to the Hall effect generator 12 will be detected and will be converted to a voltage that is proportional to the current in the conductor. As illustrated in FIG. 4, a test coil TC can be provided, so that a current can be applied to the test coil to test the magnetic circuit-current sensor operation. The voltage output can be measured and graphed as a function of the known current in the test coil.

In a preferred embodiment, permalloy ferromagnetic rings are used, such as Carpenter Steel HyMu80®, that are annealed for magnetic properties. This material should be annealed in a dry hydrogen or vacuum, oxygen-free atmosphere with a dew point below −40° F. at 2050° F. to 2150° F. for 2 to 4 hours. The rings are furnace cooled to 1100° F., and from 1100° F. to 700° F. at a rate between 350° F. to 600° F. per hour. As shown below, an object is to obtain very high permeability. The width of the air gap 18 is determined experimentally for high sensitivity. In the described embodiment, an air gap of 40 mils has been found to be effective.

The Hall effect generator 12 can be a SENTRON 1SA-1V single-axis magnetic sensor in an SOIC-8 package. The spacer 14 is made from 30% glass-filled polyetherimide (ULTEM2300). The ferromagnetic rings, spacer and Hall effect chip are aligned using the holes 32 and tabs 33. The holes can be used with rivets to hold the rings and spacer together tightly against the Hall effect chip, and/or the parts can be secured with suitable adhesive. Metal etching primer is applied to metal surfaces where adhesives are used to bond the spacer, rings and Hall effect chip together. The Hall effect chip and the ferromagnetic assembly are soldered onto the circuit board so that it does not contact the circuit board except at the Hall effect chip solder joints so that no thermal stresses can be applied to the ferromagnetic assembly.

Figure 5:
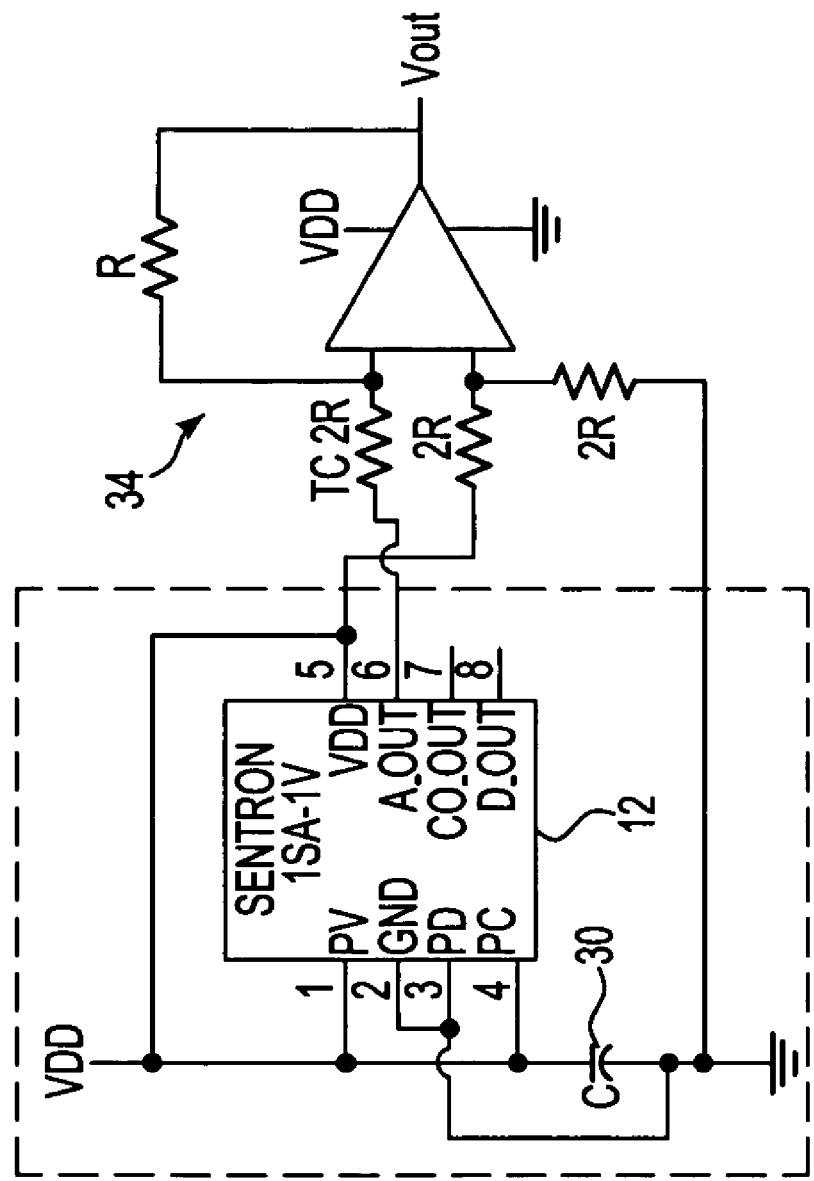
FIG. 5 is a circuit diagram illustrating connection points of aspects of the circuit of the invention including a Hall effect generator and a temperature compensation circuit.

A circuit diagram is shown in FIG. 5. The basic circuit is composed of the Hall effect generator 12 and a temperature compensating circuit 34. The TC resistor for the ideal configuration was 680 PPM per degrees C.

Figure 6:
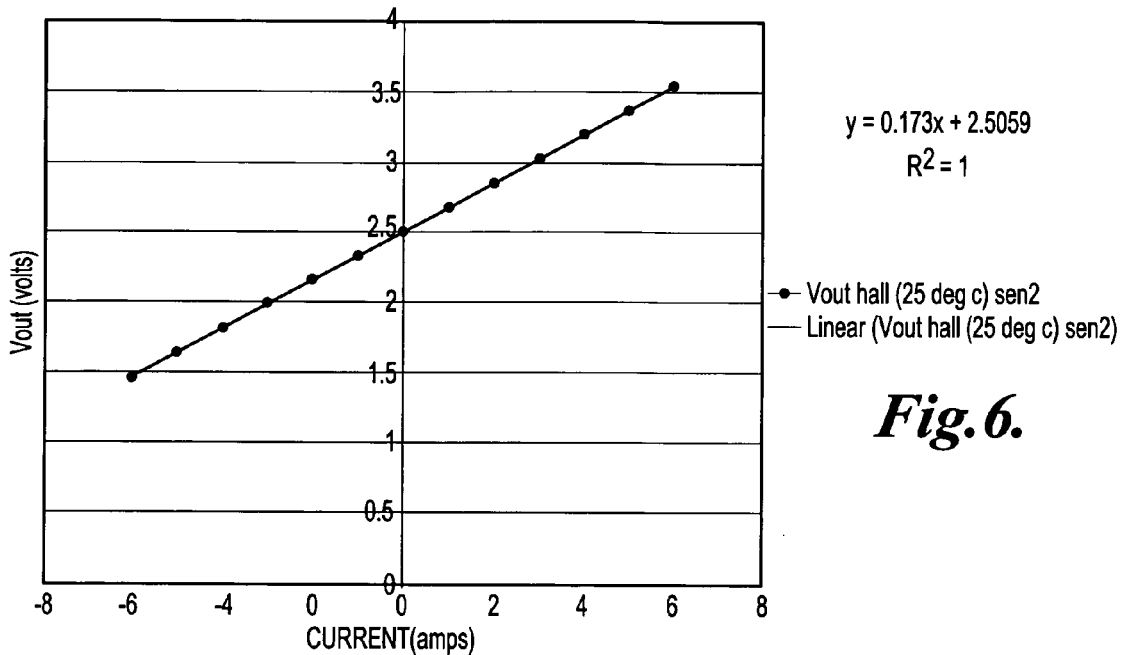
FIG. 6 is a graph illustrating performance of the current sensor in accordance with FIGS. 1-5, but without the temperature compensation circuit.

A current sensor in accordance with the above description was built and evaluated, but without the temperature compensation circuit 34. FIG. 6 displays voltage out versus current for the current sensor at 25° C. from −6 to 6 amps DC. Voltage out was recorded while the current varied positive and negative multiple times to show any hysteresis effects. The hysteresis is very small. The sensitivity is 173 mv per amp and the linearity is very good with a perfect correlation coefficient of 1.

Figure 7:
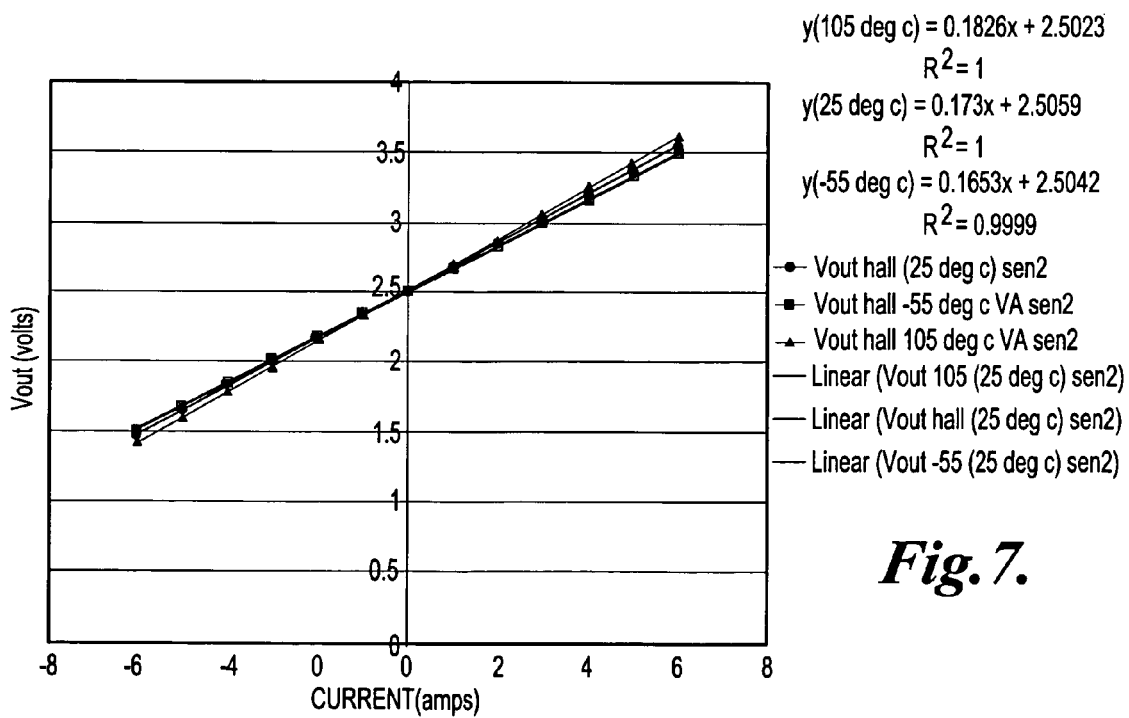
FIG. 7 is another graph illustrating performance of the current sensor in accordance with FIGS. 1-5, also without the temperature compensation circuit.

FIG. 7 shows the same graph for three temperatures (−55, 25 and 105° C.), still without a temperature compensation circuit. As temperature varies the linearity does not change appreciably, but the slope of the line or sensitivity does change slightly. The slope varies from about 165 to about 183 mv per amp in the tested temperature range, still very accurate at such small currents.

Figure 8:
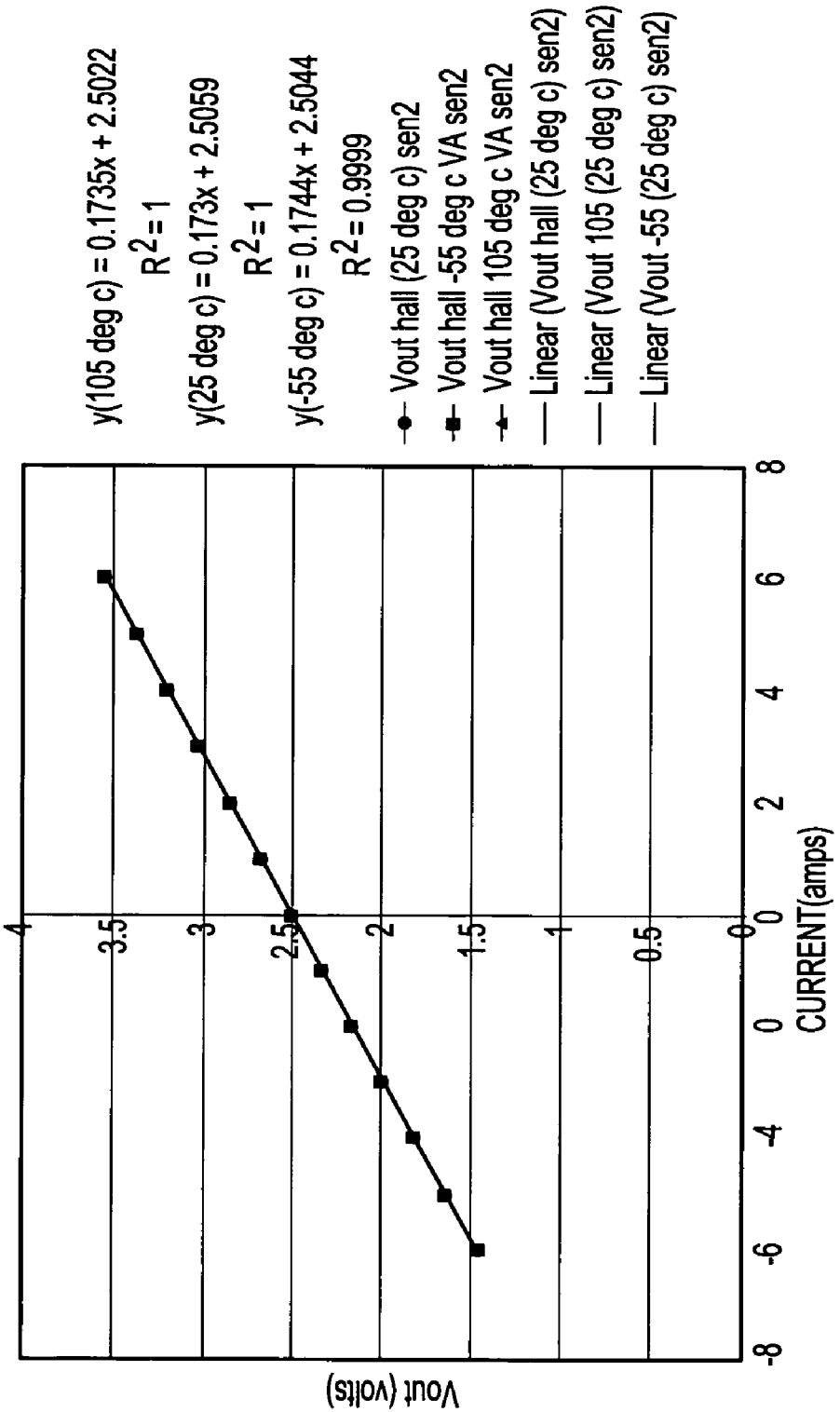
FIG. 8 is another graph illustrating performance of the current sensor of FIGS. 1-5, including the temperature compensation circuit.

FIG. 8 shows the results when the temperature compensation circuit is incorporated to reduce the thermal dependence. The temperature compensated slope only varies from 173 to 174 mv per amp. Consequently, on the scale shown, the lines and test points overlie each other. The sensor provides essentially identical outputs within the tested temperature range.

Figure 9:
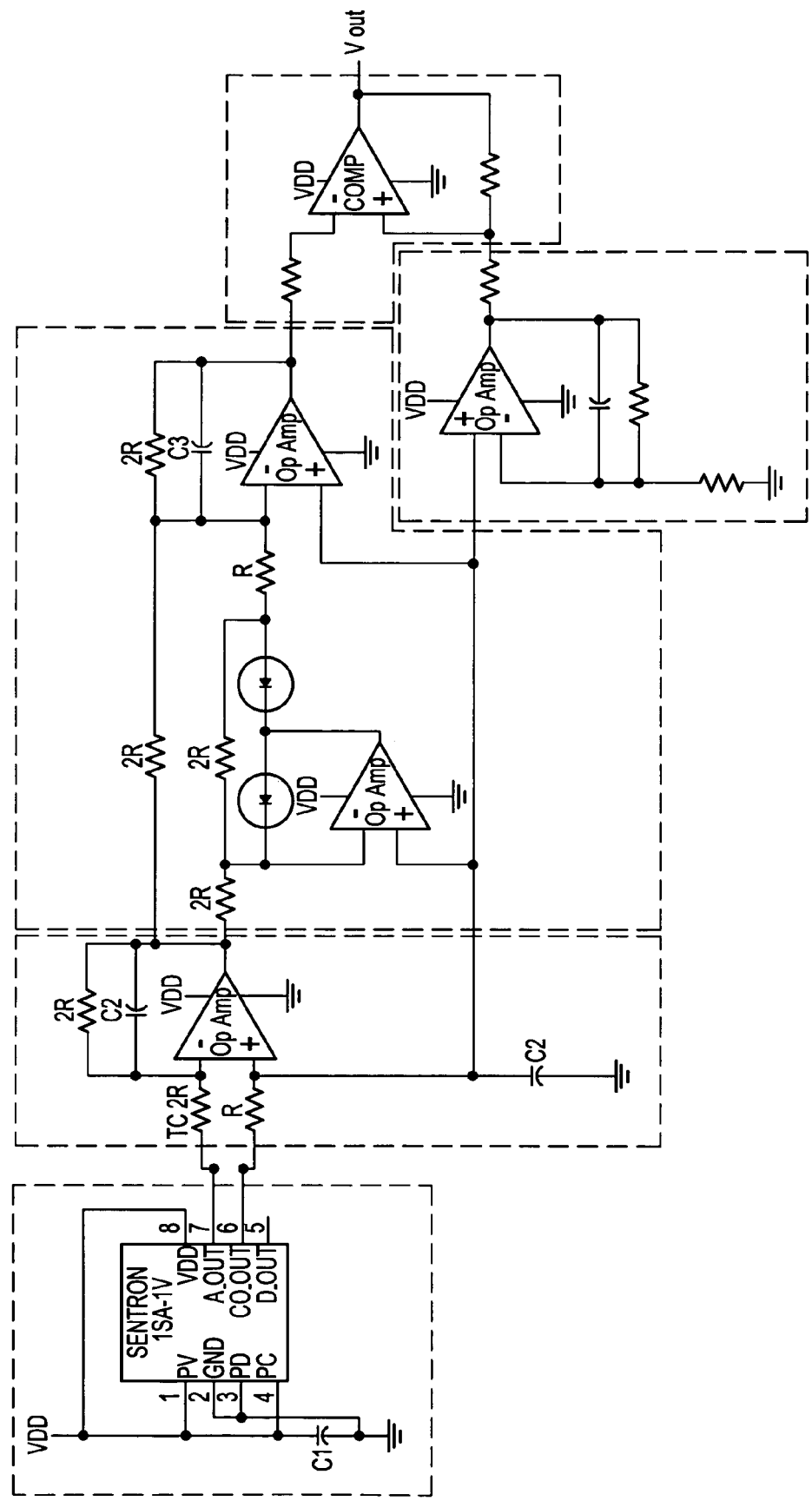
FIG. 9 is a circuit diagram of additional circuit components that may be used in the invention, including a temperature compensation circuit.

The modified circuit shown in FIG. 9 operates similarly to the circuit shown in FIG. 5. The power input, ground, and capacitor (C) connections to the Hall effect generator 12 are identical. The analog output (pin 7, A_OUT) and the common output (pin 6, CO_OUT) are both at a DC voltage level of ½ VDD with a 0 tangential B field. Using CO_OUT as a reference for the remainder of the signal conditioning circuit allows this circuit to operate from a single power supply.

The DC voltage level from these two outputs varies from device to device and also varies with temperature. The DC voltage temperature variation of the two outputs track closely. This circuit topology allows errors in signal conditioning due to component parameter variation to be minimized. The sensor and signal conditioning circuit work with both AC and DC currents.

The amplifier and temperature compensation stage 34 following the sensor 12 accomplishes two things. The first is the bandwidth of the signal from the sensor is limited while balancing the impedances on the two inputs to the amplifier 35. This is necessary if the sensor and circuit are to operate in harsh environments such as those found in the aerospace or automotive industries. The second is the gain of this stage temperature compensates the slope variation in the sensor output due to temperature. As noted above, the TC resistor for the ideal configuration was 680 PPM per degrees C. The slope correction could be reversed if the TC resistor is placed in the feedback position instead of the input position. As the current increases in the conductor looped through the sensor, A_OUT responds with an output positive relative to the CO_OUT reference and negative relative to the reference if the current is in the opposite direction. An absolute value and bandwidth limiting circuit 36 converts the output from circuit 34 to a positive output relative to the CO_OUT reference regardless of the direction of the current in the wire looped through the sensor. Capacitor C3 can be chosen to be very large so that the output of the absolute value circuit is a DC value. This capacitor can also be chosen so that the absolute value output is a full wave rectified AC signal referenced to CO_OUT for applications requiring faster response.

A reference-scaling amplifier 38 derives the reference for a threshold detector 40 from the CO_OUT reference in the SENTRON device 12. This also helps minimize errors due to component parameter variations since the detector reference varies with the absolute value circuit reference. Experimental results indicate that bandwidth limiting is also required here since noise from the input signal will also couple to the CO_OUT reference output. The bandwidth of the reference-scaling amplifier should be set to a value similar to that for the signal amplifier connected to the A_OUT sensor output.

The threshold detector 40 is a simple single-ended comparator since the absolute value circuit creates a positive output regardless of the direction of the current in the sensor. The threshold detector compares the absolute value output with the scaled reference and triggers follow on circuitry as the output of the comparator changes state.

Advantages are obtained by forming the ferromagnetic rings of a material with high permeability, preferably greater than 30,000. Using Ampere's law, the equation can be written for the flux concentrator (core) and the air gap as follows, where H represents the H field, l represents distance (airgap width and mean ferromagnetic diameter), N represents number of "turns" (number of times the conductor passes through the sensor), I represents conductor current, and μ represents permeability:

$$H_{airgap} l_{airgap} + H_{core} l_{core} = N_{turns} I_{wire} \quad \text{EQ 1}$$

$$\frac{B_{airgap} l_{airgap}}{\mu_o} + \frac{B_{core} l_{core}}{\mu_o \mu_{core}} = N_{turns} I_{wire} \quad \text{EQ 2}$$

EQ 3 shows the sensitivity of the B (δB) field in the air gap to the temperature change (δT).

$$\frac{\partial B_{airgap}}{\partial T} = -l_{core}l_{airgap}\left[\frac{1}{\mu_{core}}\frac{\partial B_{core}}{\partial T} + \frac{1}{\mu^2}B_{core}\frac{\partial \mu_{core}}{\partial T}\right] \quad \text{EQ3}$$

The objective is to increase the sensitivity to the current in the wire, reduce the magnetic hysteresis, reduce the variation over temperature and improve linearity. From Equations 2 and 3 it can be shown that if the permeability of the core ($\mu_{core}$) were very large then Equation 2 would become $$\frac{B_{airgap}l_{airgap}}{\mu_o} = N_{turns}I_{wire} \quad \text{EQ4}$$

and Equation 3 would reduce dramatically if not disappear, that is, temperature sensitivity is essentially eliminated. The design becomes linear and reduces the variation over temperature. Permalloy, if annealed correctly, can have a permeability of 30,000 to 100,000 and the magnetic hysteresis is almost nonexistent. To increase the sensitivity, a Hall device that is sensitive to fields that are tangential to the chip and two permalloy rings (field concentrators) preferably are used. In this case, the design will get two times the field change for a change in current. For the new design there is improved linearity, low magnetic hysteresis, decreased sensitivity to temperature variation and twice the sensitivity. If an amplifier with a TC resistor is added to the output of the Hall device the temperature variation can be removed even more.

While illustrative embodiments have been illustrated and described, it will be appreciated that various changes can be made therein without departing from the spirit and scope of the invention.

The invention claimed is:

1. A sensor for sensing current flowing through a conductor comprising:
   a nonmagnetic mounting member;
   a Hall effect generator mounted on the member;
   a first ferromagnetic ring of generally C shape having opposing ends separated by an air gap, the ferromagnetic ring being mounted with the air gap overlying the generator but without the generator protruding into the air gap, and at least one loop of the conductor passing through the ferromagnetic ring; and
   a circuit including the generator for supplying an output as a function of the strength of a magnetic field having a direction tangential to the generator, which magnetic field is caused by current flowing through the conductor.

2. The sensor described in claim 1, including a second ferromagnetic ring having opposing ends separated by an air gap, the mounting member and generator being secured between the first and second ferromagnetic rings with the air gaps adjacent to the generator.

3. The sensor described in claim 2, in which each of the first and second ferromagnetic rings has a permeability of at least 30,000.

4. The sensor described in claim 1, including a circuit board having a semicircular mounting recess snugly receiving approximately one half of the circumference of the first ferromagnetic ring.

5. The sensor described in claim 2, including a circuit board having a semicircular mounting recess snugly receiving approximately one half of the circumference of the first ferromagnetic ring.

6. A sensor for sensing current flowing through a conductor comprising:
   a nonmagnetic mounting member;
   a Hall effect generator mounted on the member;
   a first ferromagnetic ring of generally C shape having a central opening therethrough and opposing ends separated by a first narrow air gap, the first ferromagnetic ring being mounted with the first air gap overlying the generator but without the generator protruding into the first air gap, and with the conductor passing through the central opening of the first ferromagnetic ring; and
   a circuit including the generator for supplying an output as a function of the strength of a magnetic field having a direction tangential to the generator, which magnetic field is caused by current flowing through the conductor.

7. The sensor described in claim 6, including a second ferromagnetic ring having a central opening therethrough and opposing ends separated by a second narrow air gap, the mounting member and generator being secured inbetween the first and second ferromagnetic rings with the central openings aligned axially and the air gaps adjacent to but on opposite sides of the generator.

8. The sensor described in claim 7, in which each of the first and second ferromagnetic rings has a permeability of at least 30,000.

9. The sensor described in claim 6, including a circuit board having a semicircular mounting recess snugly receiving approximately one half of the circumference of first ferromagnetic ring.

10. The sensor described in claim 7, including a circuit board having a semicircular mounting recess snugly receiving approximately one half of the circumference of the first ferromagnetic ring.

11. A sensor for sensing current flowing through a conductor comprising:
    a horseshoe spacer ring of nonmagnetic material having opposite ends facing each other and separated by a gap;
    a Hall effect generator mounted between the ends of the spacer;
    a first ferromagnetic ring of generally C shape having a central opening and opposite ends facing each other and separated from each other by one and only one first narrow air gap, the first ferromagnetic ring being mounted with the air gap overlying the generator but without the generator protruding into the air gap;
    a second ferromagnetic ring of generally C shape having a central opening and opposing ends facing each other and separated by one and only one second narrow air gap, the second ferromagnetic ring being mounted with the second air gap underlying the generator but without the generator protruding into the second air gap, at least one section of the conductor passing through the ferromagnetic rings; and
    a circuit including the generator for supplying an output as the function of the strength of a magnetic field having a direction tangential to the generator, which magnetic field is caused by current flowing through the conductor, the horseshoe spacer being sandwiched between the first and second ferromagnetic rings with the respective air gaps at opposite sides of the Hall effective generator.

* * * * *

UNITED STATES PATENT AND TRADEMARK OFFICE
CERTIFICATE OF CORRECTION

| | |
|---|---|
| PATENT NO. | : 7,298,132 B2 |
| APPLICATION NO. | : 11/403544 |
| DATED | : November 20, 2007 |
| INVENTOR(S) | : K. Woolsey et al. |

Page 1 of 1

It is certified that error appears in the above-identified patent and that said Letters Patent is hereby corrected as shown below:

| COLUMN | LINE | ERROR |
|---|---|---|
| 6 (Claim 9, line 3) | 31 | "of first" should read --of the first-- |
| 6 (Claim 11, line 28) | 65 | "effective" should read --effect-- |

Signed and Sealed this

Ninth Day of September, 2008

JON W. DUDAS
*Director of the United States Patent and Trademark Office*